United States Patent

Lavochkin

Patent Number: 5,829,516
Date of Patent: Nov. 3, 1998

[54] LIQUID COOLED HEAT SINK FOR COOLING ELECTRONIC COMPONENTS

[75] Inventor: Ronald B. Lavochkin, Bow, N.H.

[73] Assignee: Aavid Thermal Products, Inc., Concord, N.H.

[21] Appl. No.: 547,196

[22] Filed: Oct. 24, 1995

Related U.S. Application Data

[63] Continuation-in-part of Ser. No. 166,871, Dec. 15, 1993, abandoned.

[51] Int. Cl.⁶ .................................. F28F 7/00; F28F 1/32
[52] U.S. Cl. ........................ 165/80.4; 165/171; 165/185; 29/890.038; 257/714; 361/699
[58] Field of Search ................... 165/80.4, 168, 165/171, 185; 257/714; 361/699; 156/293; 29/890.03, 890.038, 890.04

[56] References Cited

U.S. PATENT DOCUMENTS

| | | |
|---|---|---|
| 2,522,365 | 9/1950 | Greene .............................. 29/890.03 X |
| 3,275,921 | 9/1966 | Fellendorf et al. . |
| 3,643,131 | 2/1972 | Scherbaum . |
| 4,185,369 | 1/1980 | Darrow et al. ....................... 165/170 X |
| 4,187,711 | 2/1980 | Lavochkin et al. . |
| 4,378,626 | 4/1983 | Eitel ................. 29/890.04 X |
| 4,508,163 | 4/1985 | McCarthy . |
| 4,509,839 | 4/1985 | Lavochkin . |
| 4,544,942 | 10/1985 | McCarthy . |
| 4,933,746 | 6/1990 | King . |
| 5,040,096 | 8/1991 | Churchill et al. . |
| 5,154,792 | 10/1992 | Patterson ................................. 156/293 |
| 5,454,428 | 10/1995 | Pickard et al. ...................... 165/178 X |

FOREIGN PATENT DOCUMENTS

| | | | |
|---|---|---|---|
| 157370 | 10/1985 | European Pat. Off. .......... 29/890.038 |
| 137035 | 10/1981 | Japan ..................................... 165/183 |
| 61-51861 | 3/1986 | Japan ..................................... 257/714 |
| 221655 | 9/1988 | Japan ..................................... 257/714 |
| 262861 | 10/1988 | Japan ..................................... 165/80.4 |
| 286349 | 11/1989 | Japan ..................................... 257/714 |
| 240951 | 9/1990 | Japan . |
| 142026 | 6/1991 | Japan . |
| 677293 | 4/1991 | Switzerland .......................... 165/80.4 |
| 758524 | 10/1956 | United Kingdom .................. 165/80.4 |
| 826625 | 1/1960 | United Kingdom .................. 165/170 |
| 2079655 | 1/1982 | United Kingdom .............. 29/890.038 |

*Primary Examiner*—Leonard R. Leo
*Attorney, Agent, or Firm*—Cohen, Pontani, Lieberman & Pavane

[57] ABSTRACT

A liquid cooled heat sink for cooling heat generating components. The heat sink has a base member with open ended channels formed in at least one surface thereof. The open ends of the channels have a span less than a span across a lower portion of the channels. A fluid conduit is disposed in said channels. The fluid conduit has an outer span greater than the span across the open ends of the channels and a flattened surface which is substantially coplanar with the surface of the heat sink base member having the channels therein.

9 Claims, 8 Drawing Sheets

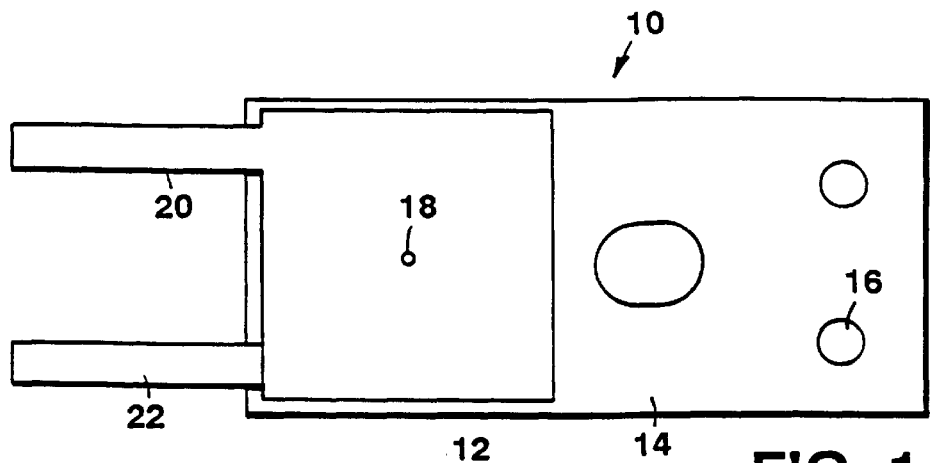
FIG. 1
(PRIOR ART)
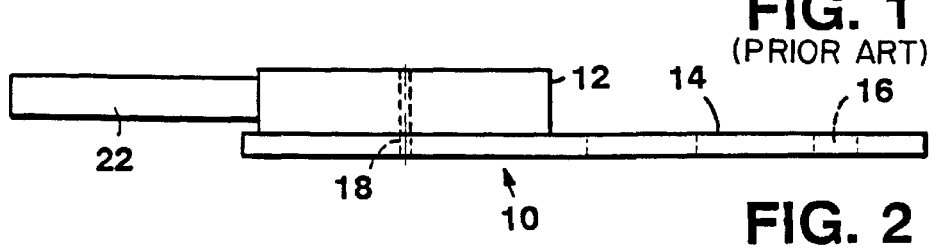
FIG. 2
(PRIOR ART)
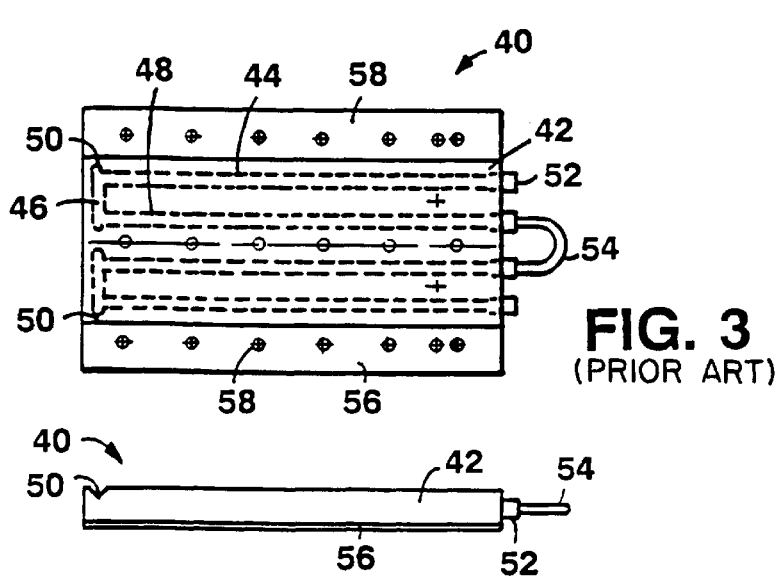
FIG. 3
(PRIOR ART)
FIG. 4
(PRIOR ART)
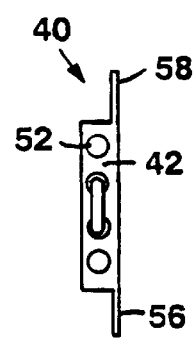
FIG. 5
(PRIOR ART)

LIQUID COOLED HEAT SINK FOR COOLING ELECTRONIC COMPONENTS

RELATED APPLICATIONS

This patent application is a continuation in part of my patent application, Ser. No. 08/166,871 filed Dec. 15, 1993, now abandoned, and assigned to the same assignee as the present invention.

FIELD OF THE INVENTION

The present invention relates to improvements in heat sinks for cooling heat generating components and particularly for cooling electronic components.

DISCUSSION OF THE RELATED ART

Electronic semiconductor components, and other heat generating sources, have power handling limitations which are determined by several factors. All electronic components, while extremely efficient, incur some internal losses in the creation of useful work. The internal losses of energy are caused by circuit resistances or change in conduction states. This energy is expressed in the form of heat which, if not properly controlled or removed, will cause the internal temperature (or energy state) to reach a point where the electronic device will not properly operate. Since it is the objective of the electronic component end user to extract as much useful work as possible out of the component, the component manufacturer will create an internal structure that will either minimize the losses or if that is not adequate, provide an efficient thermal path for conduction (or transferal) of the heat energy out of the component. If it is the latter, an external component, normally referred to as a "heat sink", is used to absorb the heat energy and, ultimately, transfer it to whatever replenishable cooling fluid is available to the end user.

Heat energy (which is continuously generated by the operating component), once created, can only "flow" from a hot region to a relatively cold region. The rate (or ease) at which this energy can be transferred is primarily determined by three modes of heat transfer. The first is conductive heat transfer. This mechanism is based on the ability of any solid material to conduct heat through itself. The key parameters are: available temperature difference ($\Delta T$), the material's conductivity (k), the length of the thermal path (l) and the cross-sectional area (A) through which the heat has to flow. This can be expressed in an equation as:

$$Q = kA\Delta T/l$$

The second mechanism is convective heat transfer. This is based on the ability of a replenishable fluid (typically air or water) to absorb heat energy through intimate contact against a hotter solid surface. Its key parameters are: available temperature difference ($\Delta T$), the fluid's absorptive characteristics (h) and the amount of surface contact area (A). This is expressed as:

$$Q = hA\Delta T$$

The final mechanism is radiative heat transfer. This is based on the emission of low level energy waves from a solid surface to distant cooler surfaces or fluid molecules; similar to heat radiated from a fireplace. It is dependent on: available temperature difference ($\Delta T$), the emissivity of a surface (E), the amount of exposed surface area to radiate (A). This can be expressed as:

$$Q = EA\Delta T$$

It is the interaction of these three modes that determines how easily heat energy is transferred away from the critical operating surfaces of a component (like a semiconductor device). In the typical use of a heat generating component, the heat energy first flows, via conduction heat transfer, to the cooler external surface. Next, if a heat sink is in contact with that surface, the heat energy will again flow, via conduction, across the interfacing surfaces to the cooler adjacent heat sink. The heat energy then flows through the heat sink, via conduction, to its cooler external, or internal surfaces exposed to a replenishable fluid. At this point, the heat energy is transferred, via convection and radiation, to the cooler ambient fluid. However, there are several real and practical, limitations that influence the flow of heat energy. First, and probably, most important is that there is a discrete, and relatively fixed, available temperature difference. Most electronic semiconductor components will not operate reliably when their internal active (junction) surface exceeds 150° C. and the generally available cooling fluids typically have an initial, entering ambient temperature of 25° to 50° C. Admittedly, an end user could use some form of a refrigeration cycle to sub-cool the fluid, but the economic penalty imposed usually limits this to a last resort solution.

The next limiting factor is imposed by the practical characteristics of cooling fluids available to the end user. Generally air (as a gas), water or other liquid compounds are used. Each fluid has fixed physical parameters that must be considered and accommodated with respect to the flow of heat. For example, dense fluids (like water) can absorb large amounts of heat energy in a small volume. Conversely, a gas (like air) can only absorb smaller amounts of heat energy in a large volume. Finally, the solid materials that comprise the requisite conductive path, from the heat source to the cooling fluid, have their own fixed physical parameters, such as thermal conductivity.

It is within the constraints imposed by all of the above that a heat sink operates. A heat sink's relative performance is characterized by the term "thermal resistance", ($\Theta$), which essentially reflects these constraints. The formula is expressed:

$$\Theta = \frac{\Delta T}{Q}$$

where $\Delta T$ is the available temperature gradient and Q is the heat energy to be dissipated. When the amount of heat energy is relatively low, and a reasonable temperature gradient exists, air is usually the preferred cooling medium. Various types of heat sinks have been designed for operation with this fluid. They range from simple stamped metal shapes to progressively larger, and more complex, extrusions and fabricated assemblies. At some point, however, the amount of heat energy to be transferred exceeds the ability of an air cooled heat sink. Large amounts of energy require large amounts of exposed surface area. Large surface area requires large conductive supporting structures to distribute the heat energy. Large conductive structures have long thermal paths. Eventually, the conductive path losses exceed the gains of more convective (and radiative) surface area.

At this point, a liquid cooled heat sink is utilized. As explained earlier, a liquid can absorb large amounts of heat energy at relatively low temperature gradients. As a result, the conductive thermal path is usually the limiting factor, when the amount of heat energy is high or the temperature gradient is low. Initially, liquid cooled heat sinks were fabricated out of copper for this reason. Copper has a relatively high, thermal conductivity and was widely used in liquid systems by virtue of its ease of fabrication. FIGS. 1 and 2 illustrate a conventional liquid cooled heat sink 10 having a copper block 12 which is mounted on a mounting plate or base 14. The base 14 typically includes mounting holes 16 as well as a centering hole 18 for locating the heat generating device. The liquid cooled heat sink also includes inlet and outlet pipes 20, 22.

Another type of conventional liquid cooled heat sink is shown in FIGS. 3–5. This copper heat sink 40 includes a set of machine drilled conduits 44, 46, 48 which act together to form the passageway for the liquid coolant. Conduit 46 forms the connecting channel at one end of the heat sink and runs perpendicular or transverse to the conduits 44, 48. Conduit 46 contains a plug 50 to prevent liquid from emptying out. At the end of the machined conduits, copper adapter pipes 52 are inserted and soldered, or brazed, in place. U-shaped connector pipes 54 an also be used to connect adjacent conduits. The liquid cooled heat sink 40 includes mounting holes 58 disposed in flange sections 56.

These figures illustrate the practical shortcomings of current designs. Both designs require extensive machining and have a significant potential for leaks because of either large planar bond lines or multiple joints and plugs used to connect internal passages. Additionally, there is a measurable thermal loss (gradient) due to the distance (typically between 0.13"–0.50") the heat energy must traverse to the cooling fluid. Another shortcoming is that copper is a relatively costly material and thus the designs have a high unit cost. Consequently, there are other liquid cooled designs that attempt to reduce the unit cost by either using less expensive materials along with simpler, less complex, fabrication techniques.

FIGS. 6 and 7 disclose another conventional liquid cooled heat sink 60. In this type of liquid cooled heat sink, the aluminum block 62 has been extruded and the copper tubing 64 is disposed on the back side of the heat sink.

FIGS. 8 and 9 illustrate yet another version of a liquid cooled heat sink 70. In this version, the copper tube 74 is sandwiched between two aluminum blocks 72. The fluid passages are made from a singular piece of copper tubing that has been bent into a multiple of parallel cooling passages. The aluminum body (for mounting of the heat generating devices) is extruded to minimize fabrication costs.

FIGS. 6 and 7 illustrate a cold plate 60 that is made from one piece of aluminum 62 with grooves to hold the tubing 64. FIGS. 8 and 9 show a cold plate 70 that consists of two pieces of aluminum 72 with the tubing 74 "sandwiched" between them. In each case, a heat conducting compound, such as thermal grease or adhesive is used to eliminate the air gaps between the extruded body and the tubing. While these designs are less expensive to construct, they are also less effective in the removal of heat energy. They are made with aluminum, a less conductive material than copper and they introduce an additional interface to the flow of the heat. The thermal compound is necessary to fill the gap between the tube and the body. While this compound is significantly better for transferring heat than air, it adds another temperature gradient to the detriment of performance of the heat sinks. As can be seen clearly from FIG. 10, the heat generated by electronic components 90 must be transferred through the block 82 and then the interface 88 by conductivity and then removed via the cooling liquid flowing through the tubes 84.

In all of the prior art liquid cooled heat sinks, the heat transfer does not occur by direct conduction from the heat generating component to the liquid containing passage. These heat sinks include a measurably large thickness of solid material and, in some designs, interface compounds that add a commensurately large temperature gradient to the flow of heat energy. These features essentially limit the amount of the heat energy that can be effectively removed, or transferred, in these designs.

SUMMARY OF THE INVENTION

The present invention relates to a liquid cooled heat sink that efficiently transfers the heat energy from the heat generating components. The heat sink includes channels, or grooves, that are formed in at least one surface of the base member. The channels contain the fluid conduits that have been constrained by the channels. The fluid filled conduits have a planar surface which is substantially coplanar with the surface of the heat sink which is in contact with the heat generating component. It is this structure that substantially improves the heat sink's effectiveness in removing heat energy. There is only a minimal thickness (0.03" instead of 0.38") of solid conduit material between the heat source and the cooling fluid medium. The much larger thicknesses as well as the gap filling thermal compound of the prior art have been eliminated in all sections where the conduit contacts the heat generating component. The elimination of these "losses", in the thermal path, thus results in an improvement in the liquid cooled heat sink's performance. In addition, the gain in performance is accomplished without incurring additional costs in manufacturing the preferred embodiment.

Further, improved localized heat transfer within the fluid conduits is accomplished by providing the channels with local deformations which are incorporated into the surface of the fluid conduit as it is pressed into place.

It is an object of the present invention to provide a liquid cooled heat sink which provides better heat transfer performance than conventional heat sinks.

It is another object of the present invention to provide a method of manufacturing of the heat sink which is economical and which positions the fluid conduit adjacent to an electronic component to be disposed thereon.

It is still another object of the present invention to provide a structure for localized improved heat transfer in selected regions of the heat sink.

The above mentioned objects are achieved by providing a liquid cooled heat sink for cooling electronic components comprising a heat sink base member having channels formed in at least one surface thereof and a fluid conduit disposed in the channels. The fluid conduit has a flattened surface which is substantially coplanar with the surface of the heat sink base member having the channels therein.

The above mentioned objects are also achieved by a method of manufacturing a liquid cooled heat sink comprising the steps of providing a heat sink base member having channels formed in at least one surface of the heat sink base member; providing a thermally conductive adhesive in the channels; inserting a fluid conduit into the channels; and pressing the fluid conduit into the channels so as to deform the fluid conduit into a shape where one surface of the fluid conduit is substantially coplanar with the surface of the heat sink base member which has the channels formed therein.

BRIEF DESCRIPTION OF THE DRAWINGS

The above objects and features of the present invention will be apparent to those skilled in the art from the following description of the preferred embodiments thereof when considered in conjunction with the appended drawings in which:

FIG. 1 is a top view showing a conventional liquid cooled heat sink and mounting structure.

FIG. 2 is a side view of the conventional liquid cooled heat sink of FIG. 1.

FIG. 3 is a top view of another conventional liquid cooled heat sink and mounting structure.

FIG. 4 is a side view of the liquid cooled heat sink of FIG. 3.

FIG. 5 is an end view of the liquid cooled heat sink according to FIG. 3.

DETAILED DESCRIPTION OF THE PREFERRED EMBODIMENTS

Figure 6:
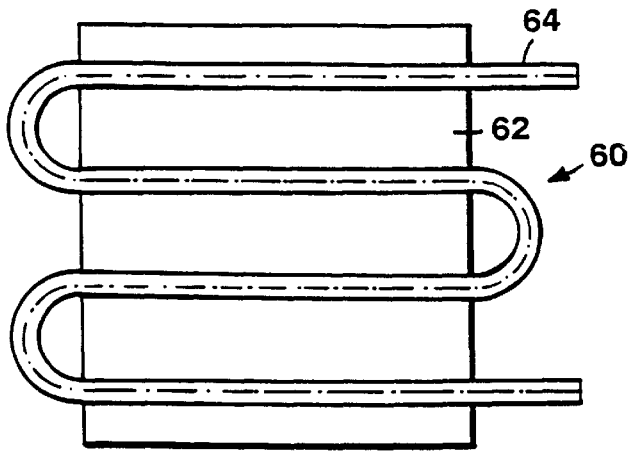
FIG. 6 is a top view of yet another conventional liquid cooled heat sink.
Figure 7:
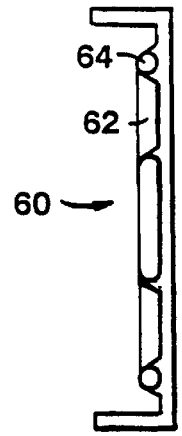
FIG. 7 is an end view of the conventional liquid cooled heat sink of FIG. 6.
Figure 8:
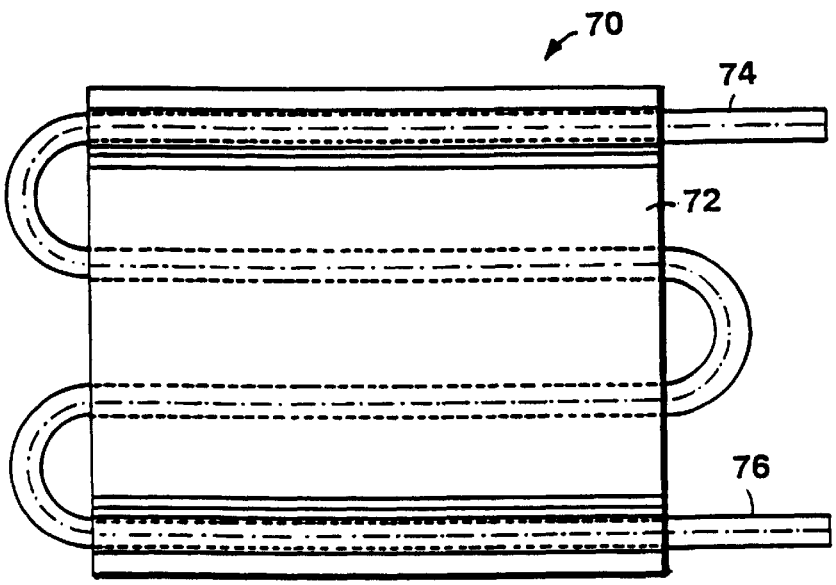
FIG. 8 is a top view of still another conventional liquid cooled heat sink.
Figure 9:
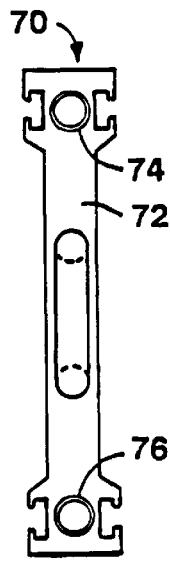
FIG. 9 is an end view of the liquid cooled heat sink of FIG. 8.
Figure 10:
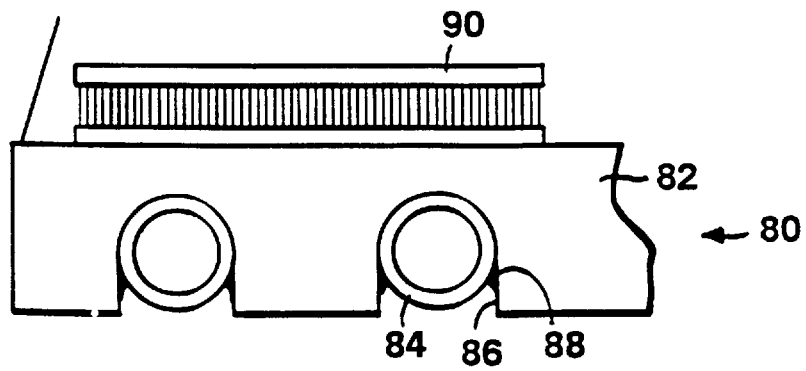
FIG. 10 is a cross sectional view of a conventional liquid cooled heat sink having an electronic component mounted thereon.
Figure 11:
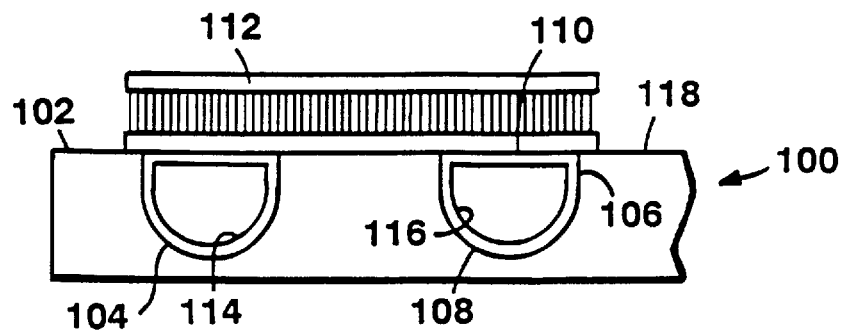
FIG. 11 is a cross sectional view of a liquid cooled heat sink having an electronic component mounted thereon according to a first embodiment of the present invention.
Figure 11A:
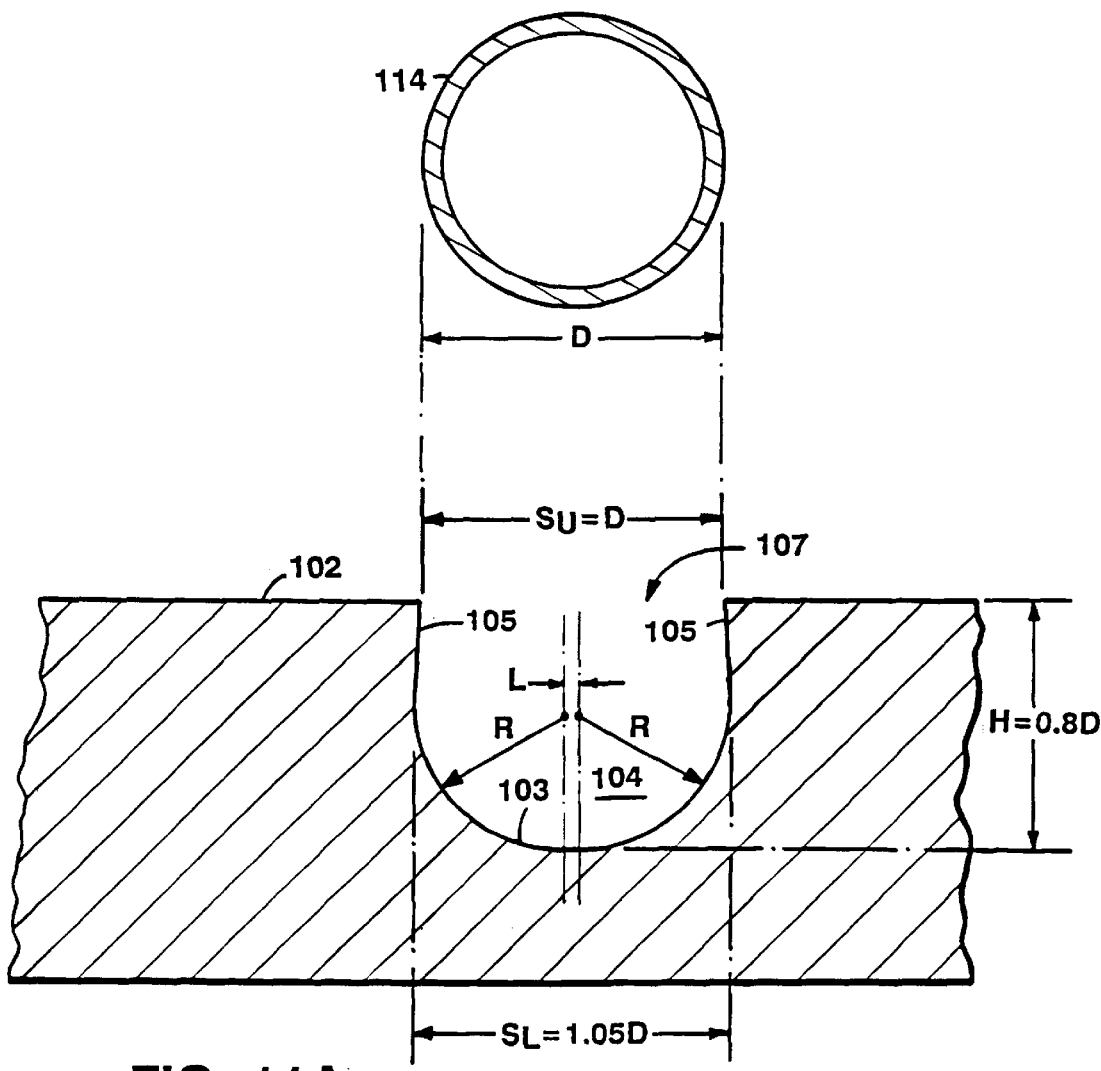
FIG. 11A is an exploded, cross sectional view of one of the channels formed in the heat sink of FIG. 11 and a conduit adapted for insertion into the channel.

FIG. 11 illustrates a liquid cooled heat sink 100 according to a first embodiment of the invention. The liquid cooled heat sink includes an aluminum base member 102 which includes substantially U-shaped channels 104, 106 disposed in one side of the aluminum base member 102. Preferably, the channels 104, 106 have a substantially semi-circular bottom portion 103. Here, the bottom portions 103 are made up of two laterally spaced 90 degree arcs, each of radius R, as shown in FIG. 11A for channel 104. The channels 104, 106 have upper side walls 105 which taper towards each other as they project toward the open end 107 of the channels 104, 106. The height, H, of the channels 104, 106 is preferably about 80 percent of the outer diameter, D, of the copper tubes 114, 116. The centers of the arcs are laterally spaced a distance, L, such that $2R+L=S_{Lower}=1.05D$, where $R=D/2$ and L is $0.05D$. Further, the span $S_{Upper}$, across the open end 107 of the channels 104, 106 is equal to the diameter of the tubes 114, 116, i.e., $S_{Upper}=D$. Thus, the span, $S_{Upper}$, across the upper end 107, or mouth, of the channel is less than the span, $S_{Lower}$ across the bottom, or lower, substantially semi-circular bottom portion 103 of the channel 104. It is noted that the bottom portion 103 of the channel 104 may be entirely semi-circular and in such case the radius, R', of such bottom portion should be about 2.5 percent greater than the diameter, D; i.e., 2R' should be about 5 percent greater than D. Copper tubes 114, 116 are disposed in the channels 104, 106. More particularly, the copper tubes 114, 116 are rolled and pressed into the channels 104, 106 so that they have upper surfaces which are flat and substantially coplanar with the upper surface of the aluminum base member 102, as shown in FIG. 11. It is noted that the narrower sides at the upper end, 107 or mouth of the channel 104, 106 will pinch the sides of the tubes 114, 116 to firmly grasp and retain the tubes 114, 116 within the channels 102, 104. Further, the copper tubes 114, 116 are attached to the aluminum base member 102 by an adhesive 108 which covers the curved surface of the tubes and provides good thermal conductivity between the base member 102 and the tubes 114, 116. The adhesive 108 can be an epoxy, a thermally conductive silicone rubber or any other type of adhesive which will provide good thermal conductivity between the tubes 114, 116 and the aluminum base member 102. It is important that the adhesive be supplied in a large enough quantity to completely cover the curved surface of the tube and remove any air gaps between the tubes 114, 116 and the base member 102. It is noted that the pinching action resulting from the narrower span across the mouth of the channel, together with the adhesive, provides the requisite forces necessary to retain the tubes within the channels in the presence of the heat transferred through the tubes and the base member 102.

The tubes 114, 116 include a flat surface 110 which is substantially coplanar with the upper surface 118 of the aluminum base member 102.

Disposed in direct contact with the tubes 114, 116 and the upper surface 118 of the base member 102 is an electronic component 112. The flat surface of the heat sink 100 provides for good thermal conductivity between the electronic component 112 and the liquid cooled heat sink 100. With this structure, heat transfer is allowed to pass directly into the fluid conduits without passing through other components.

Figure 12:
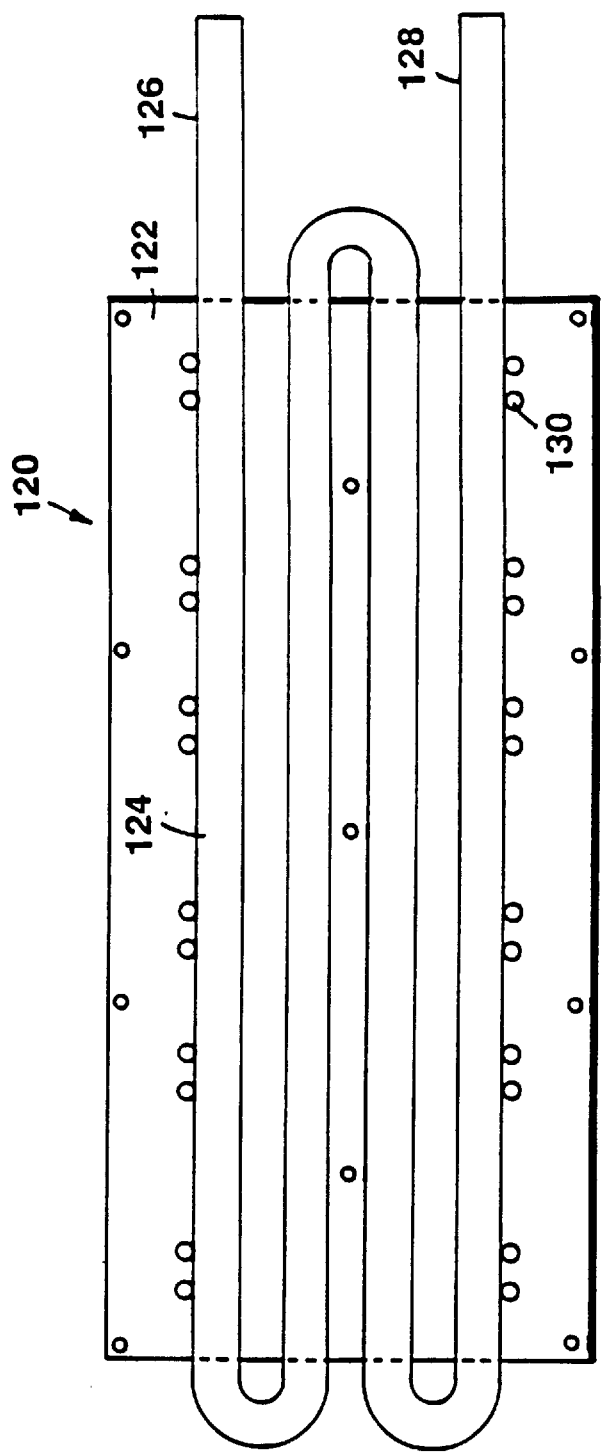
FIG. 12 is a top view of a liquid cooled heat sink according a second embodiment of the present invention.

FIG. 12 illustrates a further embodiment of the present invention. In this embodiment a liquid cooled heat sink 120 is shown. The heat sink 120 includes an aluminum block member 122 having a copper tube 124 disposed in channels formed in a surface of the aluminum block 122. The copper tube includes an inlet and outlet 126, 128. Mounting holes 130 are also provided for mounting electronic components across the four passes of the copper tube 124 disposed in the aluminum block 122.

Figure 14:
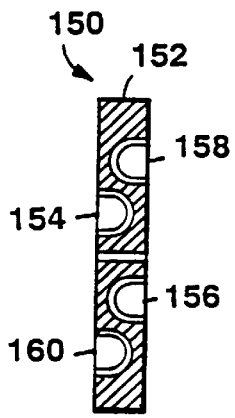
FIG. 14 is a cross sectional view of the liquid cooled heat sink taken along line XIV—XIV in FIG. 13.
Figure 13:
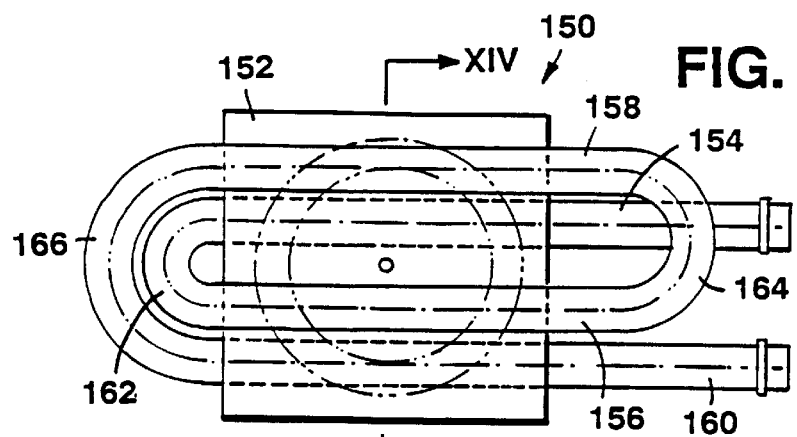
FIG. 13 is a top view of a liquid cooled heat sink according to a third embodiment of the present invention.
Figure 15:
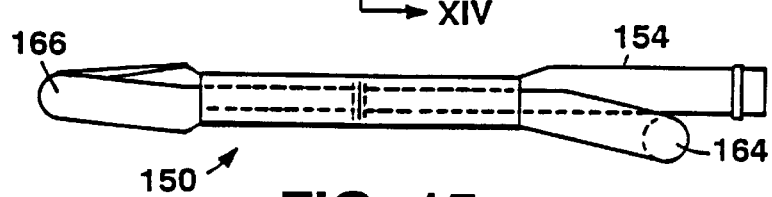
FIG. 15 is a side view of the liquid cooled heat sink according to the third embodiment of the present invention.

FIGS. 13–15 illustrate a further embodiment of the present invention. In this embodiment, a liquid cooled heat sink 150 is provided. The heat sink 150 comprises an aluminum block 152 having a copper tube disposed therein. The copper tube includes various straight sections 154, 156, 158 and 160 which are disposed in channels formed in a surface of the aluminum block 152. These sections are joined by connecting portions 162, 164 and 166.

As can be seen clearly from FIG. 14, the aluminum block or base member 152 includes channels which are formed in opposite sides of the heat sink. This allows for electronic components to be mounted on either side of the heat sink 150. The arrangement of the copper tube is such that section 154 is disposed below the aluminum block 152 as seen in FIG. 13. The U-shaped bend section 162 is then disposed at an angle so as to allow the next section of the tube 156 to be disposed in the upper surface of the heat sink 152. Likewise U-bend 164 is also disposed at an angle so that it connects section 156 with tube section 158 which is disposed below the heat sink as seen in FIG. 13. Finally U-bend section 166 is also disposed at an angle to connect tube section 158 with tube section 160. Tube section 160 is disposed below the heat sink block 152. Thus it is seen that both surfaces of the heat sink can be utilized for removing heat from electronic components which are disposed on both sides of the heat sink 150.

Figure 16:
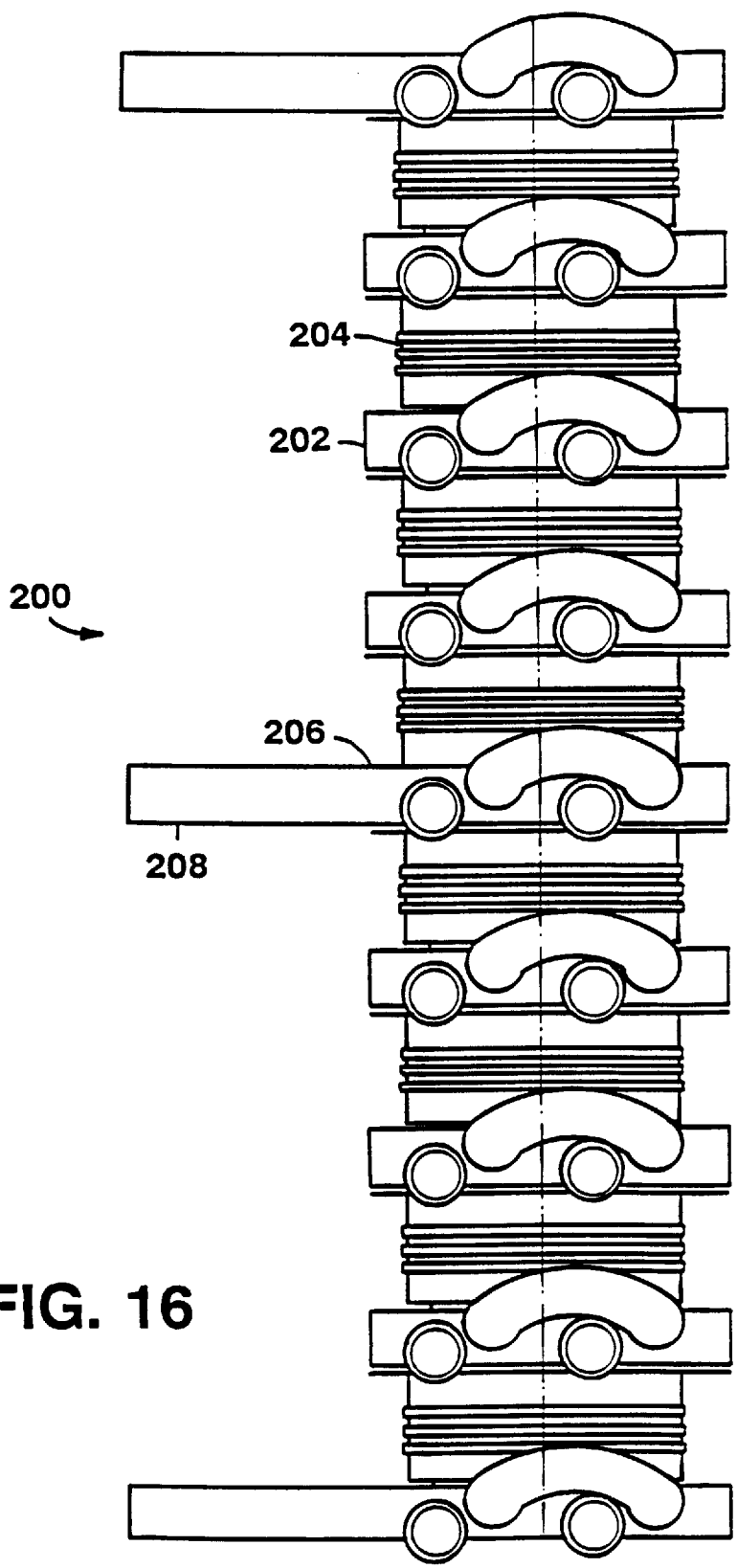
FIG. 16 is a side view of a series of electronic components which are disposed on either surface of liquid cooled heat sinks of FIG. 15, to form a stacked assembly according to the present invention.

FIG. 16 illustrates a stacked arrangement of electronic components which are spaced apart by liquid cooled heat sinks such as that shown in FIGS. 13–15. The stacked arrangement 200 includes heat sinks 202 that are disposed adjacent to the electronic component 204. Some heat sinks such as heat sink 206 include extensions 208 for various electrical connections (not shown).

The fluid's convective heat transfer rate is determined by its absorptive characteristics and the fluid passage geometry. A relatively smooth, unchanging uniform interior surface, such as a machined groove or tube will result in minimal disturbance of the fluid's flow. Conversely, a very rough surface, changes in fluid direction or passage cross section will induce disturbances in the fluid flow. Whenever a disturbance occurs, it will locally improve the fluid's heat transfer rate while slightly increasing the pressure losses. If there is no subsequent changes in the passage geometry, the disturbances will subside and the fluid's heat transfer rate will return to its prior value.

Figure 17:
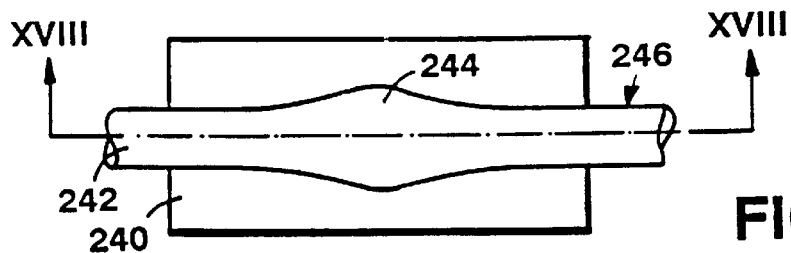
FIG. 17 is a top view of a fluid conduit disposed in a channel which is locally deformed by a turbulating structure.
Figure 18:
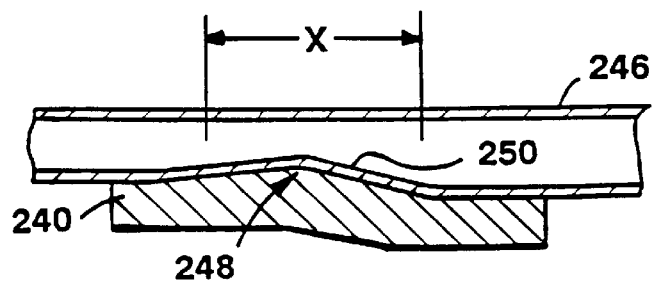
FIG. 18 is a cross sectional view taken along line XVIII—XVIII of FIG. 17 showing the fluid conduit deformation.

FIGS. 17 and 18 illustrate such an enhanced localized heat transfer mechanism according to the present invention. When liquid cooled heat sinks are used in various applications, the thermal heat flux is generally concentrated within a few locations along the thermal interface plane. In prior art fabricated designs, additional performance has been provided by machining additional cooling passages within the part. In conventional composite designs, additional performance was provided by using interior finned tubing or adding flow turbulence inserts into the fluid conduit in the heat sink. All of these methods for providing enhanced localized heat transfer incurred additional costs for the heat sink and also severely impacted the fluid pressure drop through the fluid conduits.

FIGS. 17–18 illustrate one embodiment for creating a localized cross sectional area change in the fluid conduit passage by selectively contouring the aluminum base member channel. Thus, in FIG. 17 an aluminum block section 240 is provided with a tube 246. The normal width of the tube is shown at the portion illustrated by reference numeral 242. The expanded width section, shown at 244, is what results after the fluid conduit has been inserted and pressed into the channel. It is noted that the width change at 244 has been exaggerated for purposes of illustration. The enlarged width is caused when the round copper tube 246 is inserted into the channel and contacts a ridge 248 which extends transverse to the direction of the fluid conduit 246. This ridge 248 causes a local deformation of the tube 246 as shown in the region 250. This creates a cross sectional area change in the fluid passage which improves the localized fluid heat transfer coefficient because of the disruption in the boundary layer and because of variations in the fluid velocity. The main feature of this design is that the enhanced performance is selectively located and consequently the liquid cooled heat sink's overall pressure drop is minimized.

Figure 19:
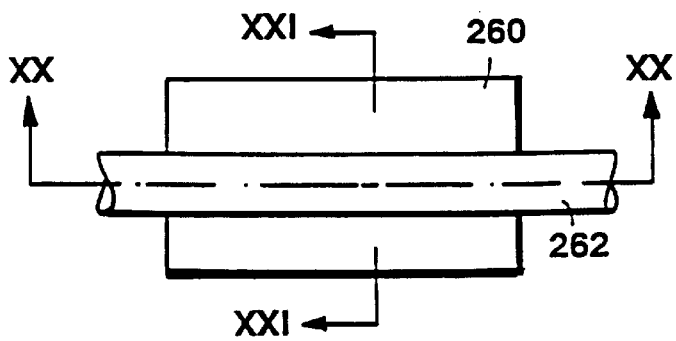
FIG. 19 is another embodiment of a fluid conduit which is locally deformed according to the present invention.
Figure 20:
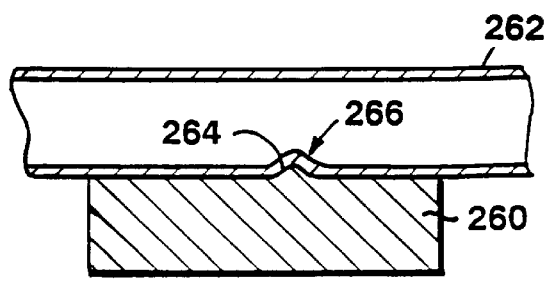
FIG. 20 is a cross sectional view taken along line XX—XX in FIG. 19.

FIGS. 19 and 20 illustrate another embodiment of the localized heat transfer improvement. FIG. 19 illustrates an aluminum block 260 having a copper tube 262 disposed therein. The block member 260 includes a bump or protrusion 264 in the surface of the channel. This causes a matching, localized bump 266 in the surface of tube 262.

Figure 21:
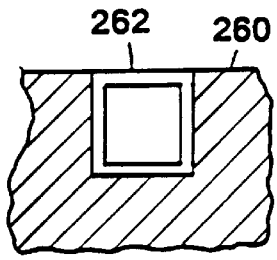
FIG. 21 is a cross sectional view taken along line XXI—XXI of FIG. 19.

FIG. 21 illustrates a cross section of FIG. 19 and shows the local deformation 266 caused by the protrusion 264.

It is also possible to use square or D-shaped in cross section tubing as long as the channels formed in the base member are provided with a contour to accept this type of tubing. Round cross sectional tubing is preferred because other shaped tubing is difficult to bend into the connections for the multipass designs.

Other types of materials, besides aluminum and copper are also possible depending on the particular application which is being used.

The method for forming the high contact heat sink is as follows. First, an aluminum block is cast or extruded in the desired shape so that it includes grooves for receiving the copper tubes therein. An alternative to casting or extruding the aluminum block would be to use a solid aluminum block and machine the channels that would receive the copper tubes as well as possibly even machining the final block shape.

Following the step of providing an aluminum block with the channels for receiving the copper tube therein, an adhesive material is put in the channels. The adhesive material can be an epoxy, a thermally conductive silicon rubber or any other type of adhesive which will provide a good thermal interface.

A round cross section copper tube is then inserted into the channels. A flat punch or press is then used to flatten one side of the tube while simultaneously forcing the remaining portion of the copper tube into contact with the adhesive and the channel walls. The object during this procedure is to eliminate all air gaps between the copper tube and the aluminum block to thereby provide a good conduction path for heat transfer.

Once the flat punch or press is removed following the tube compression step, there may be some spring back of the flattened tube wall or other irregularities which have been formed in the tube wall surface, such as crinkling of the tube surface. As a result, a further processing step may be required. In this step, the surface of the aluminum block and the surface of the flattened tube may be machined flat to provide a smooth coplanar surface. This surface will enhance thermal conductivity and thus improve the heat transfer from the heat generating component to the heat sink.

After the machining step, the heat sink can be mounted in a known manner. One type of mounting includes attaching the electronic component to the heat sink by screws.

Other methods of manufacture of the heat sink are also possible and are considered to part of this invention. One such alternative embodiment includes starting with a preshaped tube such as a D-shaped (in cross-section) tube and then casting the aluminum block around the D-shaped tube which has been preformed or bent into the desired channel shape. The cast block is then machined down to expose the flat surface of the tube so that it is coplanar with the surface of the aluminum block.

The present invention has been described in connection with certain structural embodiments and it will be understood that various modifications can be made to the above-described embodiments without departing from the spirit and scope of the invention as defined in the appended claims.

What is claimed is:

1. A liquid cooled heat sink for cooling a heat generating component in contact therewith, comprising:

a heat sink base member having an open ended channel formed in one surface thereof, said channel including a curved lower wall and a pair of side walls, each sidewall having a first end continuous with said curved lower wall and a second end terminating at said surface, said sidewalls being tapered from said first ends to said second ends, the open end of the channel having a span less than a span across a lower portion of the channel; and a fluid conduit constructed of a thermally conducting material and disposed in said channel, said fluid conduit being disposed in said channel and having an outer span greater than the span across the open end of the channel for maintaining said fluid conduit in said channel by a friction fit formed between said side walls and said fluid conduit, said fluid conduit having a flattened surface which is substantially coplanar with said one surface of said heat sink base member, the heat generating component being disposed in use in direct contact with said one surface of said heat sink base member and in overlying abutting relation with said flattened surface for establishing direct thermal contact between the heat generating component and said flattened surface.

2. A heat sink as claimed in claim 1, further comprising an adhesive disposed in said channel for holding said fluid conduit in said heat sink base member and for providing good thermal conductivity between a heat generating component and said fluid conduit.

3. A heat sink as claimed in claim 1, wherein said heat sink base member includes channel on two sides of said heat sink base member.

4. A heat sink as claimed in claim 3, wherein said channels are disposed on opposite sides of said heat sink base member.

5. A heat sink as claimed in claim 4, wherein said fluid conduit is disposed on alternative sides of said heat sink base member as the fluid conduit is positioned in said channel.

6. A heat sink as claimed in claim 1, wherein said heat sink base member is made of at least one of aluminum and aluminum alloy and said fluid conduit is made of at least one of copper and copper alloy.

7. A heat sink as claimed in claim 1, wherein at least one of said channels includes a local deformation rising from a surface of said one channel and said fluid conduit includes a local deformation directed toward the inside of said fluid conduit, said local deformation in said one channel and said local deformation in said fluid conduit being disposed adjacent to one another.

8. A liquid cooled heat sink for cooling heat generating components, comprising:

a heat sink base member having channels formed in at least one surface thereof;

a fluid conduit disposed in said channels, said fluid conduit having a flattened surface which is substantially coplanar with the surface of the heat sink base member having the channels therein, wherein at least one of said channels includes a local deformation rising from a surface of said at least one channel and said fluid conduit includes a local deformation directed toward the inside of said fluid conduit, said local deformation in said at least one channel and said local deformation in said fluid conduit being disposed adjacent to one another, and wherein said local deformation in said at least one channel is a ridge extending transverse to the direction of said fluid conduit.

9. A liquid cooled heat sink for cooling a heat generating component in contact therewith, comprising:

a heat sink base member having an open ended channel formed in one surface thereof, said channel including a curved lower wall and a pair of side walls, with each sidewall having a first end continuous with said curved lower wall and a second end terminating at said surface, said sidewalls being tapered from said first ends to said second ends so that the open end of the channel has a span less than a span across a lower portion of the channel; and a fluid conduit constructed of thermally conductive material and disposed in said channels, said fluid conduit having a flattened surface which is substantially coplanar with said one surface of the heat sink base member and in direct contact with the heat generating component, wherein said channel includes a local deformation rising from a surface of said channel and said fluid conduit includes a deformation directed toward the inside of said fluid conduit, said local deformation in said channel and said local deformation in said fluid conduit being disposed adjacent to one another.

* * * * *